US007880657B2

(12) United States Patent
Ng et al.

(10) Patent No.: US 7,880,657 B2
(45) Date of Patent: Feb. 1, 2011

(54) INTERPOLATION ACCURACY IMPROVEMENT IN MOTION ENCODER SYSTEMS, DEVICES AND METHODS

(75) Inventors: Mei Yee Ng, Perak (MY); Gim Eng Chew, Penang (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 124 days.

(21) Appl. No.: 12/393,162

(22) Filed: Feb. 26, 2009

(65) Prior Publication Data

US 2010/0213997 A1 Aug. 26, 2010

(51) Int. Cl.
*H03M 1/12* (2006.01)

(52) U.S. Cl. ......................... 341/158; 341/17; 341/111; 341/155; 341/159

(58) Field of Classification Search ................... 341/17, 341/111, 117, 155, 156, 158, 159
See application file for complete search history.

(56) References Cited

U.S. PATENT DOCUMENTS

| | | | | |
|---|---|---|---|---|
| 3,688,303 | A * | 8/1972 | Metz | 341/116 |
| 4,364,045 | A * | 12/1982 | Spiegel | 340/870.31 |
| 5,067,089 | A | 11/1991 | Ishii et al. | |
| 5,126,742 | A * | 6/1992 | Schmidt et al. | 341/156 |
| 5,200,683 | A * | 4/1993 | Taylor et al. | 318/661 |
| 5,367,202 | A * | 11/1994 | Yee | 327/540 |
| 5,376,937 | A | 12/1994 | Colleran et al. | |
| 5,519,398 | A | 5/1996 | Satoh et al. | |
| 5,706,219 | A | 1/1998 | Ishimoto | |
| 5,907,298 | A | 5/1999 | Kiriyama et al. | |
| 5,920,494 | A | 7/1999 | Setbacken et al. | |
| 6,355,927 | B1 | 3/2002 | Snyder | |
| 6,424,274 | B1 * | 7/2002 | Schnizlein et al. | 341/26 |
| 6,570,522 | B1 * | 5/2003 | Galambos et al. | 341/155 |
| 6,928,386 | B2 | 8/2005 | Hasser | |
| 7,049,857 | B2 | 5/2006 | Styduhar | |
| 7,075,465 | B2 * | 7/2006 | Jonsson et al. | 341/120 |
| 7,180,430 | B2 | 2/2007 | Ng et al. | |
| 2002/0196172 | A1 * | 12/2002 | Bult | 341/158 |
| 2004/0061044 | A1 | 4/2004 | Soar | |
| 2005/0208923 | A1 * | 9/2005 | Khorram | 455/336 |
| 2006/0071832 | A1 * | 4/2006 | Regev | 341/143 |
| 2006/0290554 | A1 * | 12/2006 | Ishii | 341/155 |
| 2008/0030239 | A1 | 2/2008 | Sullivan et al. | |
| 2008/0231326 | A1 | 9/2008 | Rai | |
| 2008/0272715 | A1 * | 11/2008 | Moller et al. | 318/34 |

OTHER PUBLICATIONS

"An innovative method to increase the resolution of optical encoders in motion servo systems," Cheung, N.C., Power Electronics and Drive Systems. 1999. PEDS apos: 99. Proceedings of the IEEE 1999 International Conference. vol. 2, 1999. pp. 797-802.

* cited by examiner

*Primary Examiner*—Linh V Nguyen

(57) ABSTRACT

Disclosed are various embodiments of interpolation circuits for use in conjunction with motion encoders. The analog output signals provided by incremental or absolute motion encoders are provided to an interpolation circuit, which is capable of providing high interpolation factor output signals having high timing accuracy. Problems with noise spikes common to zero-hysteresis comparators typically employed in interpolation circuits are eliminated, as are problems with time delays differing between comparators that do feature hysteresis. The disclosed interpolation circuits may be implemented using CMOS processes without undue effort.

22 Claims, 11 Drawing Sheets

Delay1 = Delay2

Delay1 = Delay2

INTERPOLATION ACCURACY IMPROVEMENT IN MOTION ENCODER SYSTEMS, DEVICES AND METHODS

FIELD OF THE INVENTION

Various embodiments of the inventions described herein relate to the field of motion encoders, and interpolation circuitry, components, devices, systems and methods associated therewith.

BACKGROUND

Interpolation circuitry is commonly employed in incremental and absolute digital motion encoding systems, where the interpolation circuitry is configured to generate digital pulses having higher frequencies than base sinusoidal analog signals input to the circuitry. As the interpolation factor of the circuitry increases, the accuracy of the interpolation circuitry becomes ever more critical since the output provided by such circuitry ultimately determines the accuracy of the encoding system. Unfortunately, due to the architecture of most interpolation circuitry—which typically relies on a large number of comparators—the outputs provided by interpolation circuitry tend to be noisy and contain undesired noise spikes arising from excessive switching in the comparators. As a result, the comparators employed in interpolation circuitry for motion encoders typically employ a significant amount of hysteresis to provide immunity from noise spikes. Such hysteresis itself becomes a source of inaccuracy for the interpolation circuitry, however, especially at high interpolation factors.

What is needed is interpolation circuitry for motion encoding systems that features improved immunity from noise, is capable of providing high interpolation factors, and that can provide highly accurate interpolation output signals.

SUMMARY

In some embodiments, there is provided a method of interpolating sine and cosine analog signals generated by a motion encoder, the first and second analog signals each having a first frequency comprising providing the sine and cosine signals as inputs to an interpolation processing circuit comprising first and second resistor strings configured to scale, respectively, the first and second analog signals before further processing by a plurality of comparators, each comparator being configured to generate a corresponding output pulse having a rising or falling edge timed to correspond to a predetermined one of a plurality of cross points of the scaled sine and cosine signals, and processing the sine and cosine signals in output circuitry of the interpolation processing circuit to yield a plurality of combined interpolated output signals which have a second frequency that is an integer multiple of the first frequency.

In other embodiments, there is provided an interpolation processing circuit configured to receive sine and cosine analog signals generated by a motion encoder, the first and second analog signals each having a first frequency, comprising first and second resistor strings configured to scale, respectively, the first and second analog signals, and to provide scaled analog output signals therefrom, a plurality of comparators configured to receive the scaled analog output signals, each comparator being configured to generate a corresponding output pulse having a rising or falling edge timed to correspond to a predetermined one of a plurality of cross points of the scaled sine and cosine signals, and output circuitry disposed in the interpolation processing circuit and configured to receive the outputs provided by the plurality of comparators and process same to yield a plurality of combined interpolated output signals which have a second frequency that is an integer multiple of the first frequency.

Further embodiments are disclosed herein or will become apparent to those skilled in the art after having read and understood the specification and drawings hereof.

BRIEF DESCRIPTION OF THE DRAWINGS

Different aspects of the various embodiments of the invention will become apparent from the following specification, drawings and claims in which:

The drawings are not necessarily to scale. Like numbers refer to like parts or steps throughout the drawings, unless otherwise noted.

DETAILED DESCRIPTIONS OF SOME PREFERRED EMBODIMENTS

According to one embodiment, an interpolation circuit 20 comprises a plurality of comparators which are configured to generate different edges at different times which correspond to various discrete positions of an encoder. In one embodiment, such edges are generated using two sinusoidal signals which are 90 degrees apart, and their complements, namely cosine+, sine+, cosine− and sine−. The edges are derived based on equation 1:

$$\tan\theta = \frac{B}{A}$$

where B represents cosine amplitude, A represents sine amplitude, and θ represents the angle or position.

Figure 1:
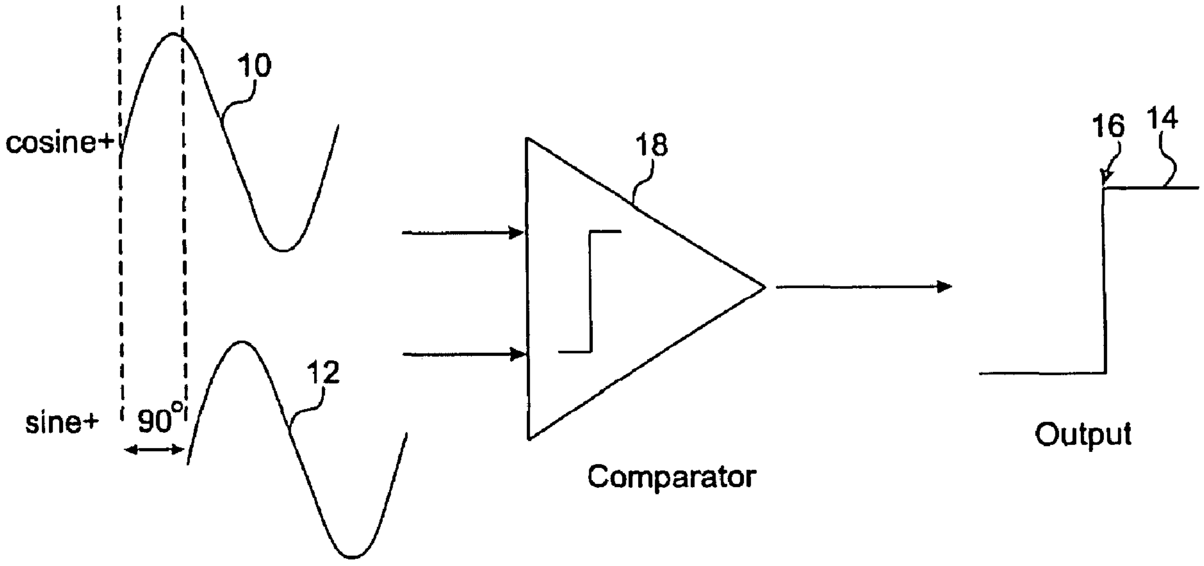
FIG. 1 shows using sine and cosine analog input signals to generate an output signal having an edge with a comparator.

By way of example, to obtain an interpolation factor of 20×, a total of 40 edges are required, that is one rising edge and one falling edge for each pulse. Each edge is generated by scaling the cosine and sine signals to appropriate sets of corresponding amplitudes, and then obtaining the cross point of each set using sets of comparators. One such comparator is in FIG. 1, where sine and cosine analog input signals 10 and 12 are used to generate output signal 14 having an edge 16 with comparator 18.

Figure 3:
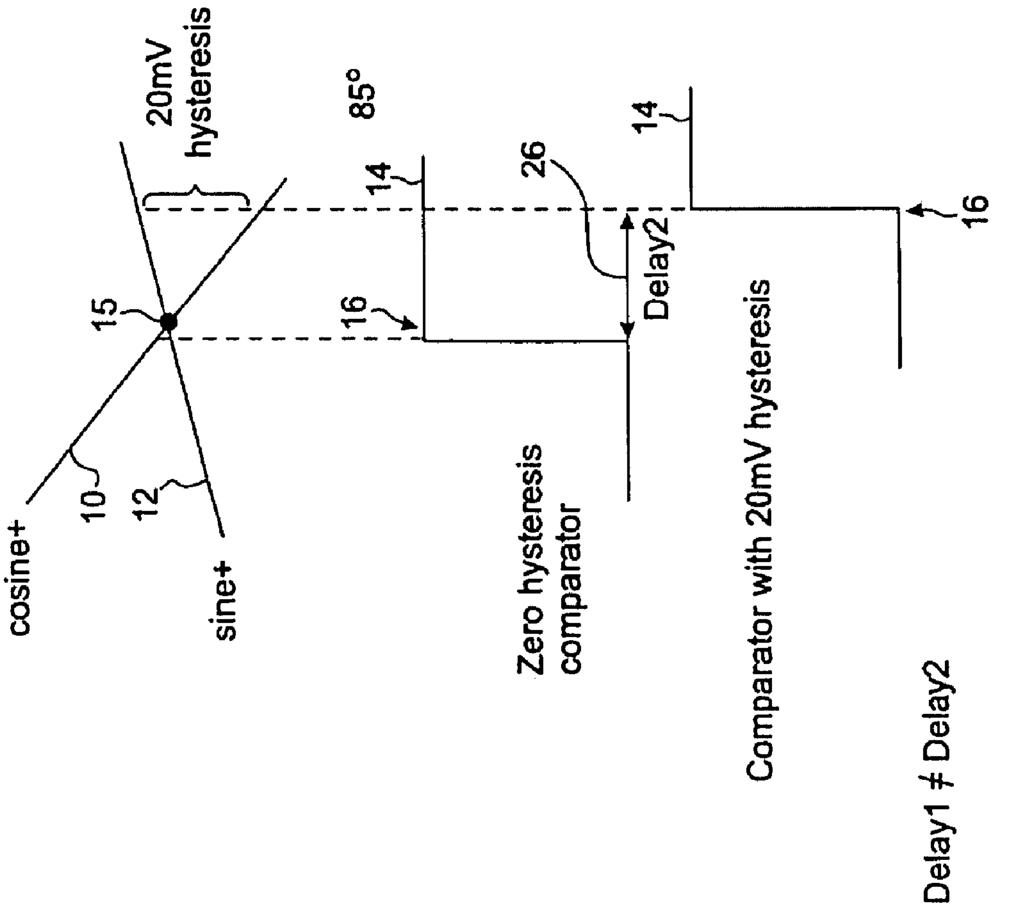
FIG. 3 illustrates the operation of a comparator with hysteresis.
Figure 2:
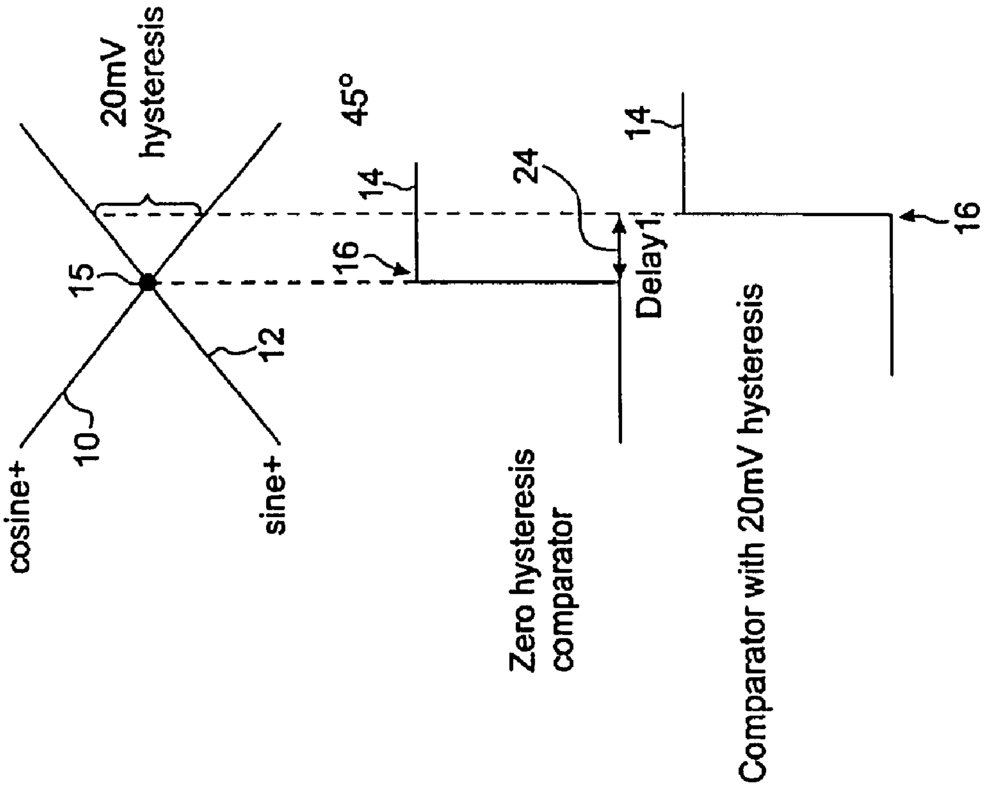
FIG. 2 illustrates the operation of a comparator with hysteresis.

FIGS. 2 and 3 illustrate the operation of comparators with hysteresis. To calculate the amplitudes required to generate edges corresponding to 45° and 85° positions of sine and cosine analog input signals illustrated in FIGS. 2 and 3, equation 1 set forth above is applied to provide the following results where the amplitude of the input cosine analog signal is assumed to be equal to B, where B=1V:

TABLE 1

Computation of Amplitudes for 45 and 85 Degree Positions

| θ = 45° | θ = 85° |
|---|---|
| $\theta = 45°$ | $\theta = 85°$ |
| $\tan\theta = \frac{B}{A}, B = 1$ | $\tan\theta = \frac{B}{A}, B = 1$ |
| $A = \frac{B}{\tan 45°} = 1$ | $A = \frac{B}{\tan 45°} = 87\text{ mV}$ |

To generate an edge corresponding to the 45 degree position, full-amplitude cosine and sine signals are fed to the input of a comparator. On the other hand, to generate the 85° edge, a full-amplitude cosine signal and a scaled-down sine signal are used. For accuracy, a zero-hysteresis comparator is favored because it will not introduce any unnecessary delay arising from hysteresis, having hysteresis.

FIG. 2 shows the edge generated by signals crossing at a 45 degree position of the encoder, while FIG. 3 shows the edge generated by an 85° degree position of the encoder. As described above, the amplitude of the sine analog signal is scaled down to 87 mV in accordance. By using a comparator with zero hysteresis, both edges can be generated accurately at the cross points of the sine and cosine analog input signals, thereby producing accurate edges at the desired positions. By using comparators with fixed hysteresis, however, errors are generated due to the different delays involved. As shown in FIGS. 2 and 3, such errors arise because Delay1 and Delay2 are not equal. A difference between the two delays causes inaccuracy in the interpolated position, and the inaccuracy is exacerbated at higher interpolation factors.

Figure 4:
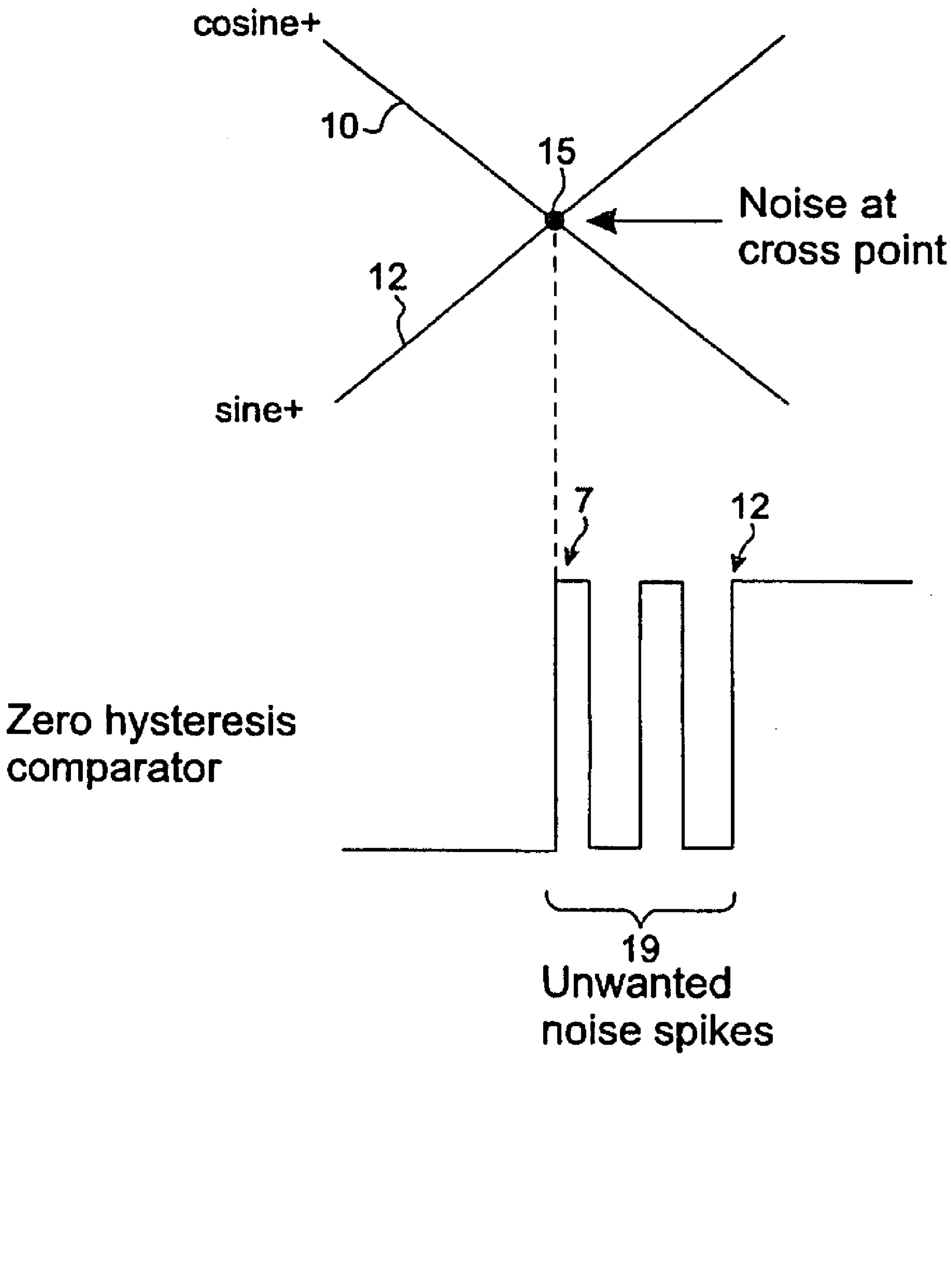
FIG. 4 illustrates the generation of undesired noise spikes at a crossover point.

Using comparators with zero hysteresis poses another problem, however, which is increased susceptibility to noise. Because comparators are often noisy circuits, a large amount of switching activity of the type found in an interpolation circuit can generate significant noise, which in turn can lead to undesired noise spikes appearing at the outputs of the comparators as depicted in FIG. 4. Consequently, while trying to preserve timing accuracy, zero hysteresis comparators have a tendency to introduce undesired noise spikes at their outputs.

Figure 5:
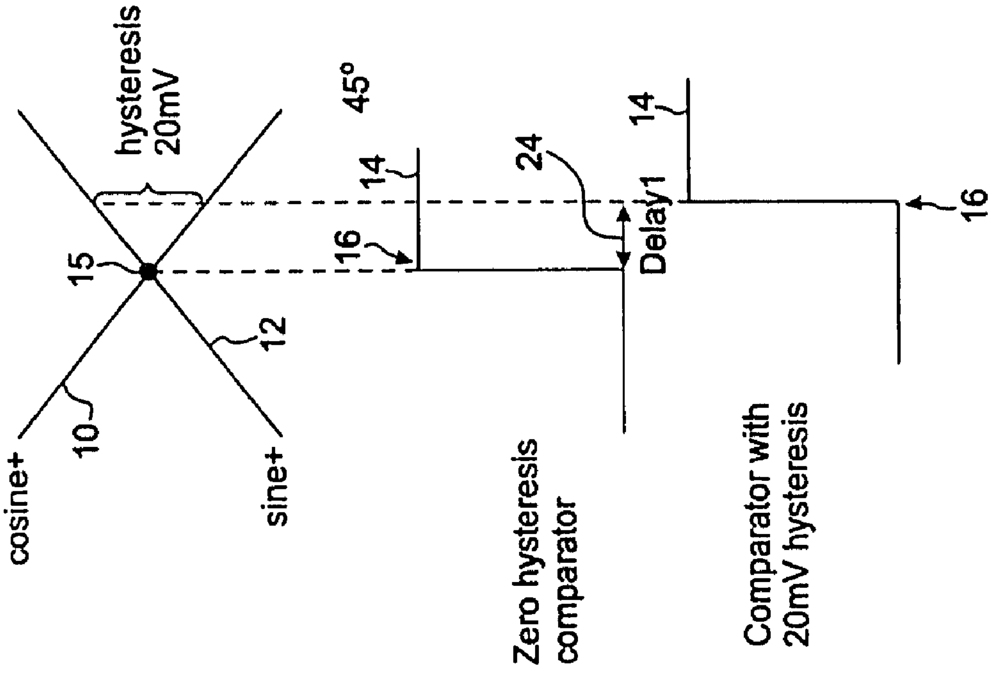
FIGS. 5 and 6 illustrate the operation of two comparators with different amounts of predetermined custom hysteresis, where the delays produced by the two comparators are substantially the same according to one embodiment of an interpolation circuit.
Figure 6:
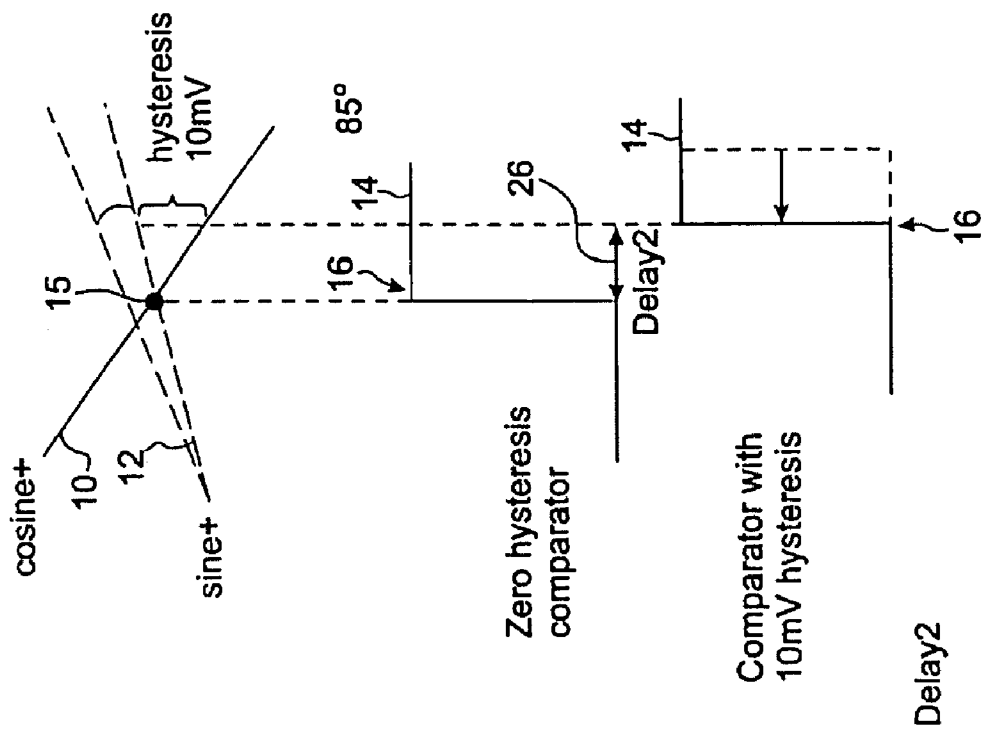

FIGS. 5 and 6 illustrate the operation of two comparators with different amounts of predetermined custom hysteresis, where the delays produced by the two comparators are substantially the same according to one embodiment of an interpolation circuit. In one embodiment, and as illustrated in FIGS. 5 and 6, customized comparators having differing predetermined fixed amounts of hysteresis are employed to process input analog signals corresponding to different positional angles of the encoder. As shown in FIGS. 5 and 6, accurate transition edges and filtered outputs having no noise spikes are provided by a fixed 20 mV hysteresis comparator for 45 degree position sine and cosine signals, while a fixed 10 mV hysteresis comparator is employed to process 85 degree position sine and cosine signals. The two comparators are configured to produce the same delays 24 and 26 for different predetermined positional angles. This is accomplished by the respective hysteresis values of the comparators being fixed at 20 mV and 10 mV, while the times required for the sine and cosine signals to reach the required hysteresis levels are different for different amplitudes. The hystereses of the two comparators are selected to provide delays that are equal for different predetermined positional angles. Hence, to obtain the same delays while maintaining cosine and since amplitudes, comparator hystereses are customized according to the required positional angles. This method ensures that the delays caused by comparator hysteresis are equal regardless of the various positional angles required to generate accurate interpolation signals. Each positional angle is customized using a different comparator hysteresis, depending on the particular delay that is required. Such a configuration is simple to implement in an interpolation circuit, and improves the accuracy of the interpolation circuit regardless of the desired magnitude of the interpolation factor.

Figure 7:
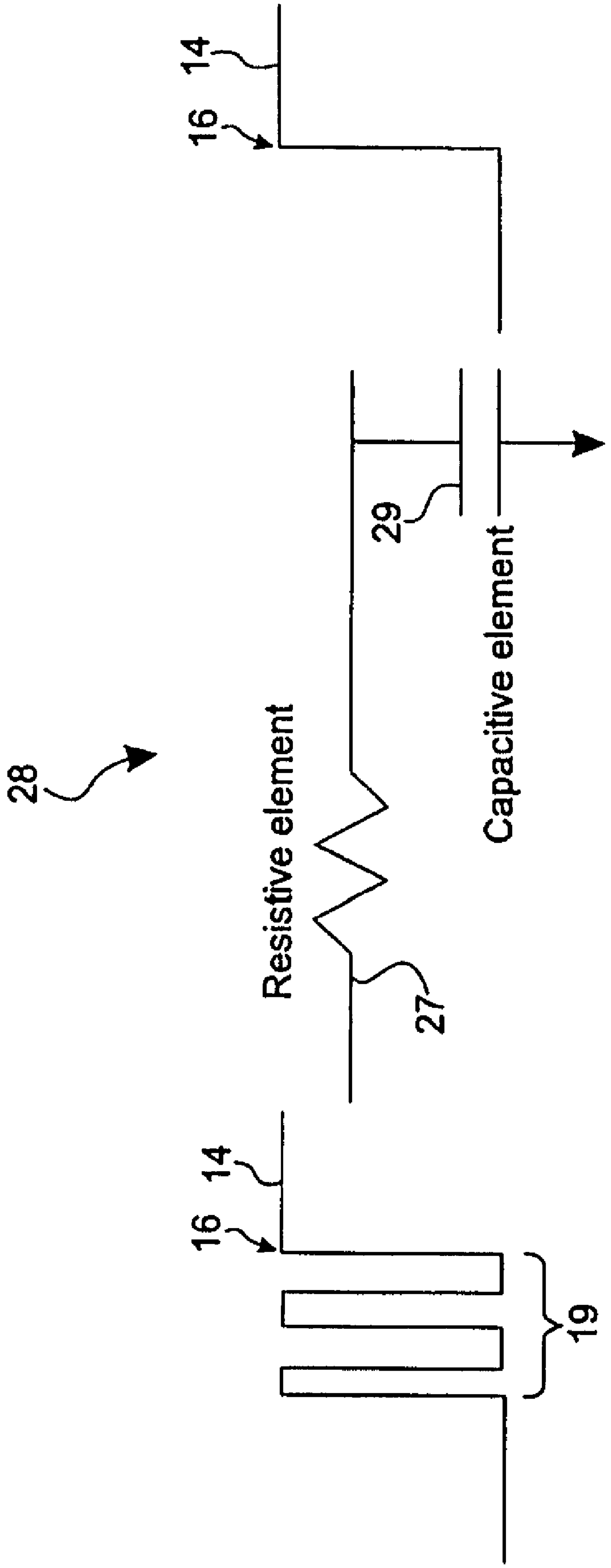
FIG. 7 illustrates the operation of a low-pass filter according to one embodiment of an interpolation circuit.

Referring now to FIG. 4, there is illustrated the behavior of a typical comparator with zero hysteresis, which while having the desirable characteristic of providing accurate timing is particularly susceptible to the generation of noise spikes and pulses at the output thereof. The noise spikes or pulses are generated at the cross point of cosine signal 10 and sine signal 12. To deal with this problem, low-pass filter circuit 28 shown in FIG. 7 may be employed in the interpolation circuit. Low-pass filter circuit 28 is a simple low pass filter constructed using resistive and capacitive elements 27 and 29 to filter out the high frequency spikes. This RC filter is connected to the output of the comparator to filter out the high frequency spikes and generate a clean output pulse 14 with a steep rising edge 12 as shown in FIG. 7.

Figure 8:
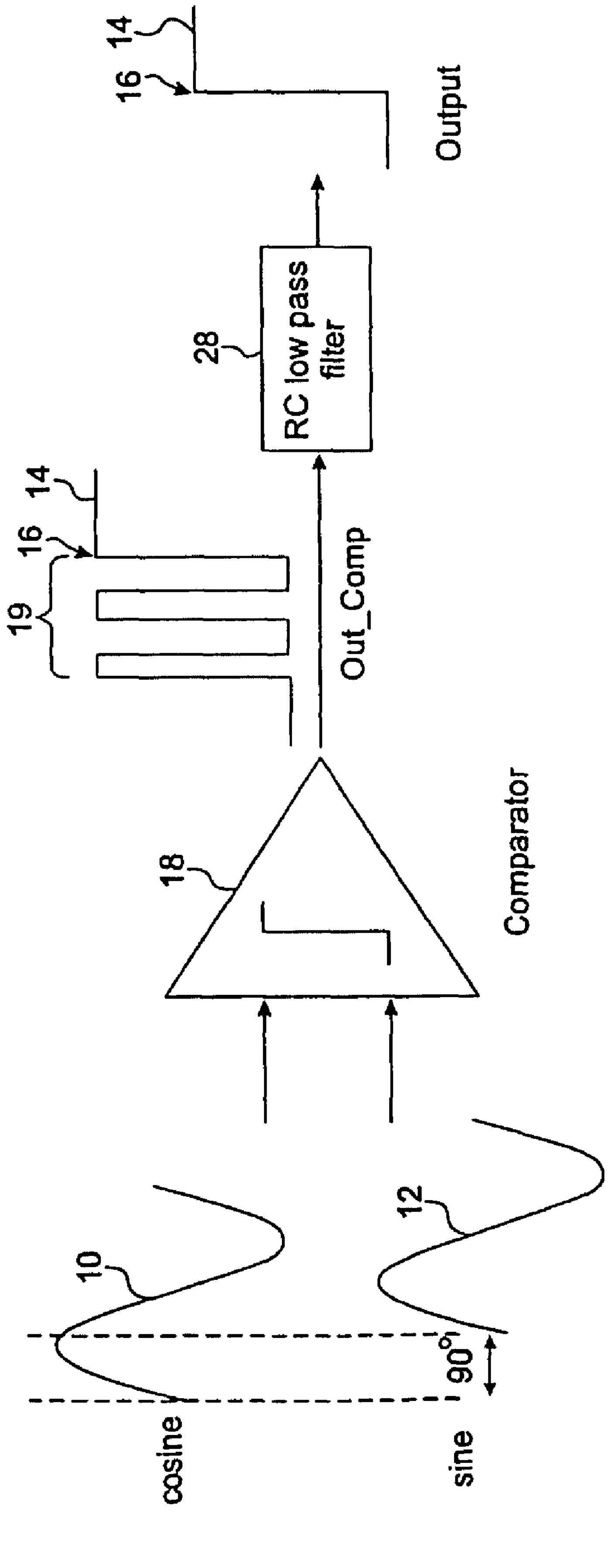
FIG. 8 illustrates the operation of a low-pass filter in combination with a comparator according to one embodiment of an interpolation circuit.
Figure 9:
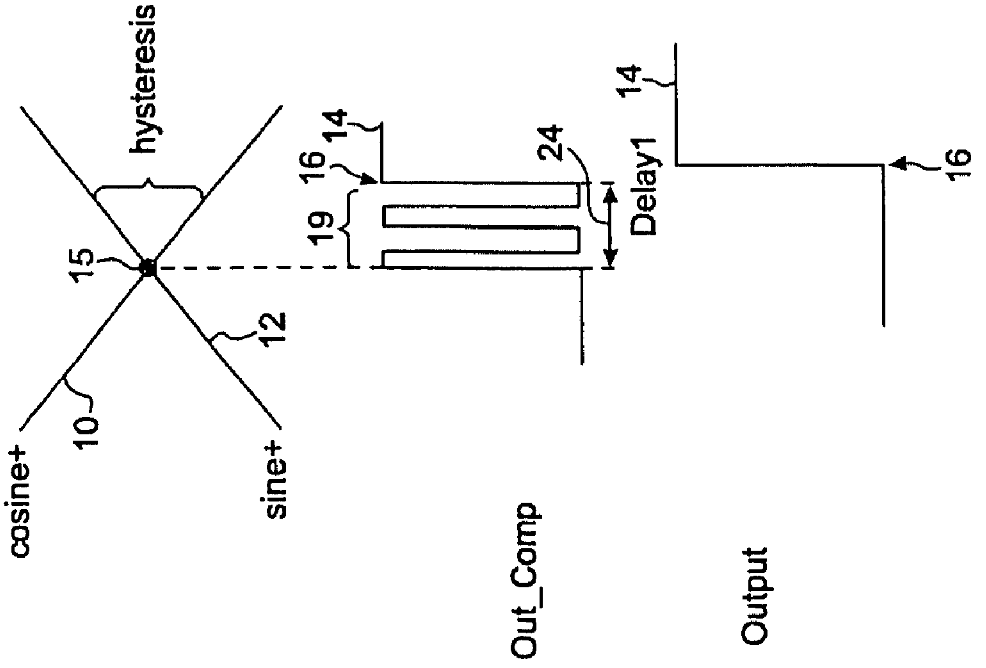
FIGS. 9 and 10 illustrate the operation of interpolation circuitry in the presence of noise, where the delays produced by different comparators having different hysteresis values are substantially the same according to one embodiment of an interpolation circuit.
Figure 10:
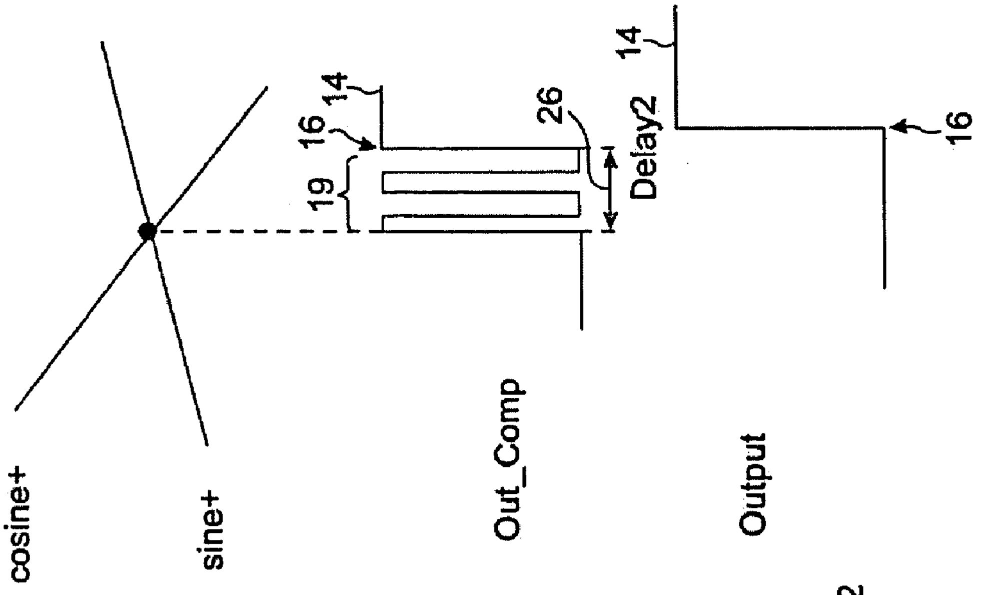

FIG. 8 illustrates the operation of a low-pass filter circuit 28 in combination with a comparator according to one embodiment of an interpolation circuit. This configuration permits the use of zero hysteresis comparators in interpolation circuit 20 while essentially eliminating noise spikes. As a result, low pass filter circuits 28 employed in combination with comparators preserve the timing accuracy required for proper operation of an interpolation circuit while eliminating the problems arising from noise spikes. Even though the resistive and capacitive components of low-pass filter circuit 28 introduce delays into the outputs, such delays may be made consistent across all the various pulse edges regardless of the amplitudes of the sine and cosine input signals. As a result, timing accuracy is not affected, as is further shown in FIGS. 9 and 10, where the operation of interpolation circuitry in the presence of noise is illustrated, and where the delays produced by different comparators having different hysteresis values are substantially the same according to one embodiment of an interpolation circuit.

Figure 11:
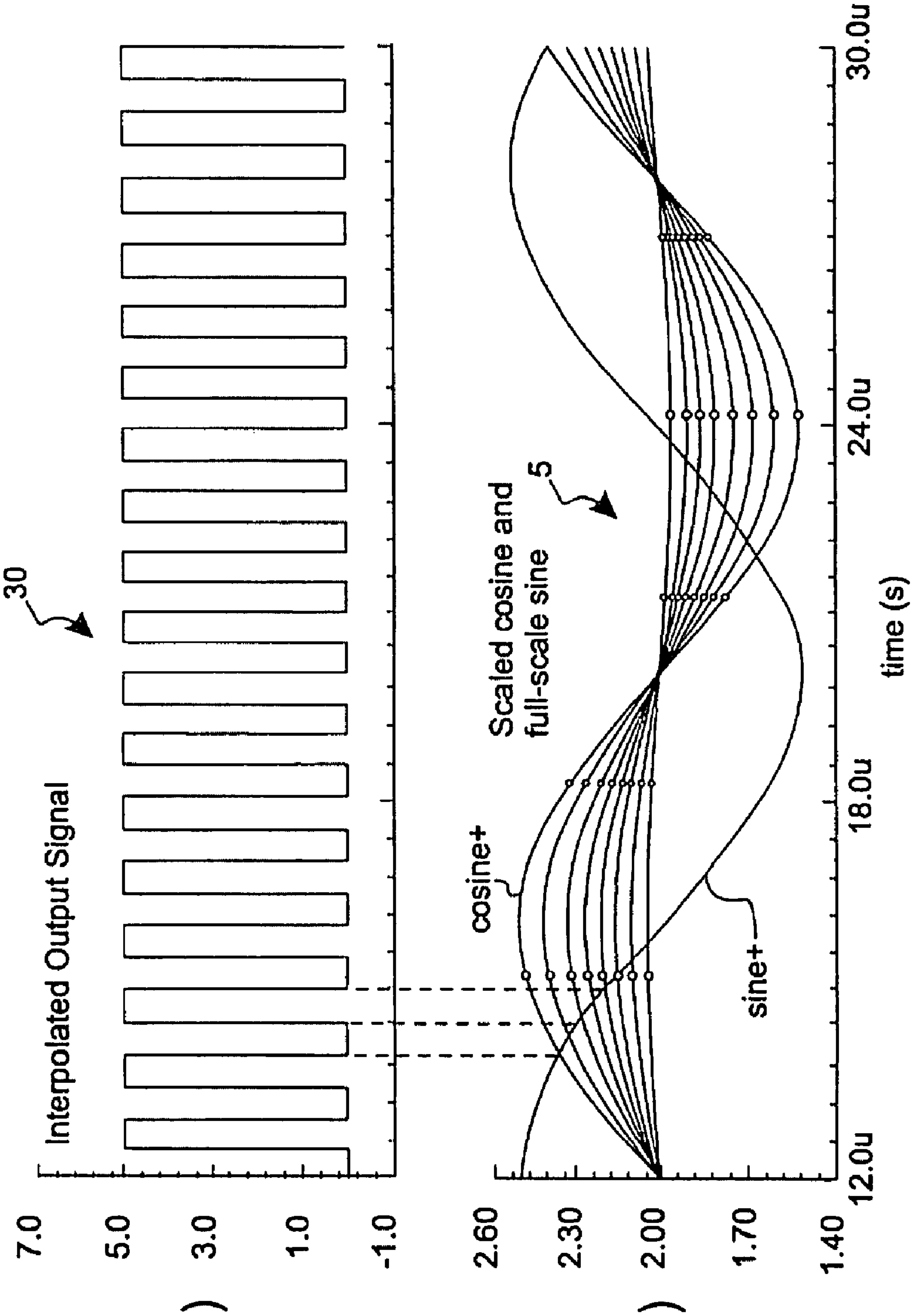
FIG. 11 shows interpolation signals generated by interpolation circuitry according to one embodiment.

Table 2 below, in conjunction with FIG. 11, show input sine and cosine signals and the interpolated output signal generated therefrom according to one embodiment:

TABLE 2

| Positional Angles and Corresponding Sine and Cosine Amplitudes Corresponding Thereto | | |
|---|---|---|
| Angle | A = sine | B = cosine |
| 4.5 | 0.0787 | 1 |
| 9 | 0.1584 | 1 |
| 13.5 | 0.2401 | 1 |
| 18 | 0.3249 | 1 |
| 22.5 | 0.4142 | 1 |
| 27 | 0.5095 | 1 |
| 31.5 | 0.6128 | 1 |
| 36 | 0.7265 | 1 |
| 40.5 | 0.8541 | 1 |
| 45 | 1.0000 | 1 |

As shown in FIG. 11, various cross points corresponding to a full-amplitude unscaled sine+ input signal and corresponding scaled cosine+ input signals 5 are employed to generate the various pulses of interpolated output signal 30, where cross points correspond to predetermined ones of the rising and falling edges of the various sequential pulses from which interpolated output signal 30 is constructed. Those skilled in the art will understand that many different variations, combinations and permutations of full-amplitude cosine and sine signals, and scaled cosine and sine signals, may be employed to produce an interpolated output signal having a desired frequency.

Figure 12:
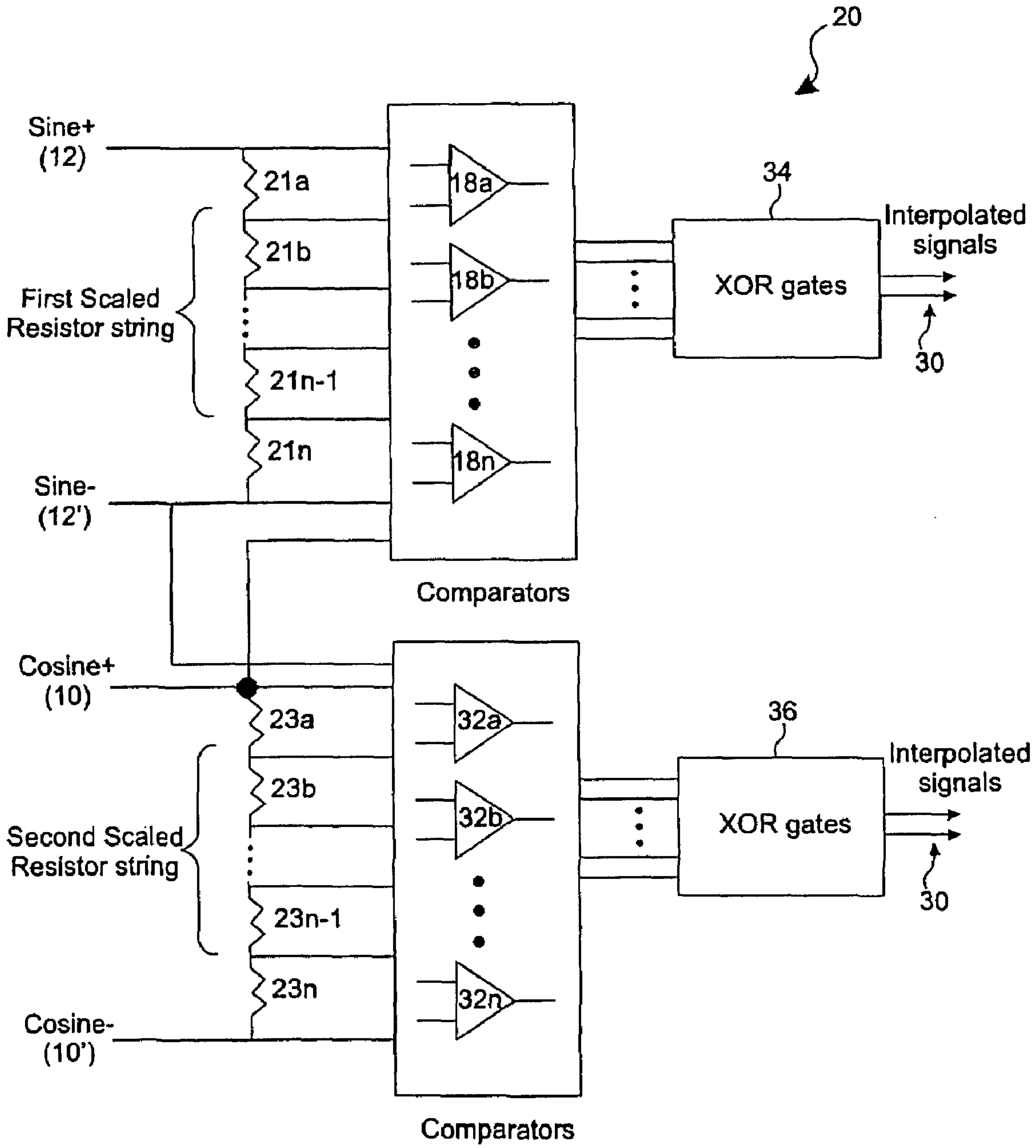
FIG. 12 shows one embodiment of interpolation circuitry comprising resistor strings, comparators and XOR gates.

FIG. 12 shows one embodiment of interpolation circuit 20 comprising first and second scaled resistor strings 21*a* through 21*n* and 23*a* through 23*n*, respectively, first and second sets of comparators 18*a* through 18*n* and 32*a* through 32*n* having 20 mV of hysteresis each, respectively, and XOR gates 34 ad 36, respectively. As shown in FIG. 12, input analog signals sine+, sine− (the complement of sine+), cosine+ and cosine− (the complement of cosine+) are provided to first and second scaled resistor strings 21*a* through 21*n* and 23*a* through 23*n*, where their respective amplitudes are scaled to appropriate predetermined values using appropriate pre-selected values for resistors 21*a* through 21*n* and 23*a* through 23*n*. Each resistor corresponds to a predetermined positional angle. The cross points of the scaled sine+, sine−, cosine+ and cosine− signals are compared against full-amplitude signals to generate rising or falling edges, as the case may be, at the output of comparators 18*a* through 32*n*. These edges are then fed into XOR gates 34 and 36, which generate interpolated signals, which signals are combined to yield the final interpolated output signal. According to one embodiment, the interpolated output signal can have a frequency up to about 20 times that of the input analog signals' frequency.

Note that resistors 21*a* through 23*n* may be adjusted so they are larger for small amplitude scaling. For example, for a positional angle of 85°, an amplitude of 87 mV is required. Since such a small amplitude may create a long delay due to hysteresis, the amplitude can be adjusted up to 100 mV to reduce the delay and match other pulse edges.

Figure 13:
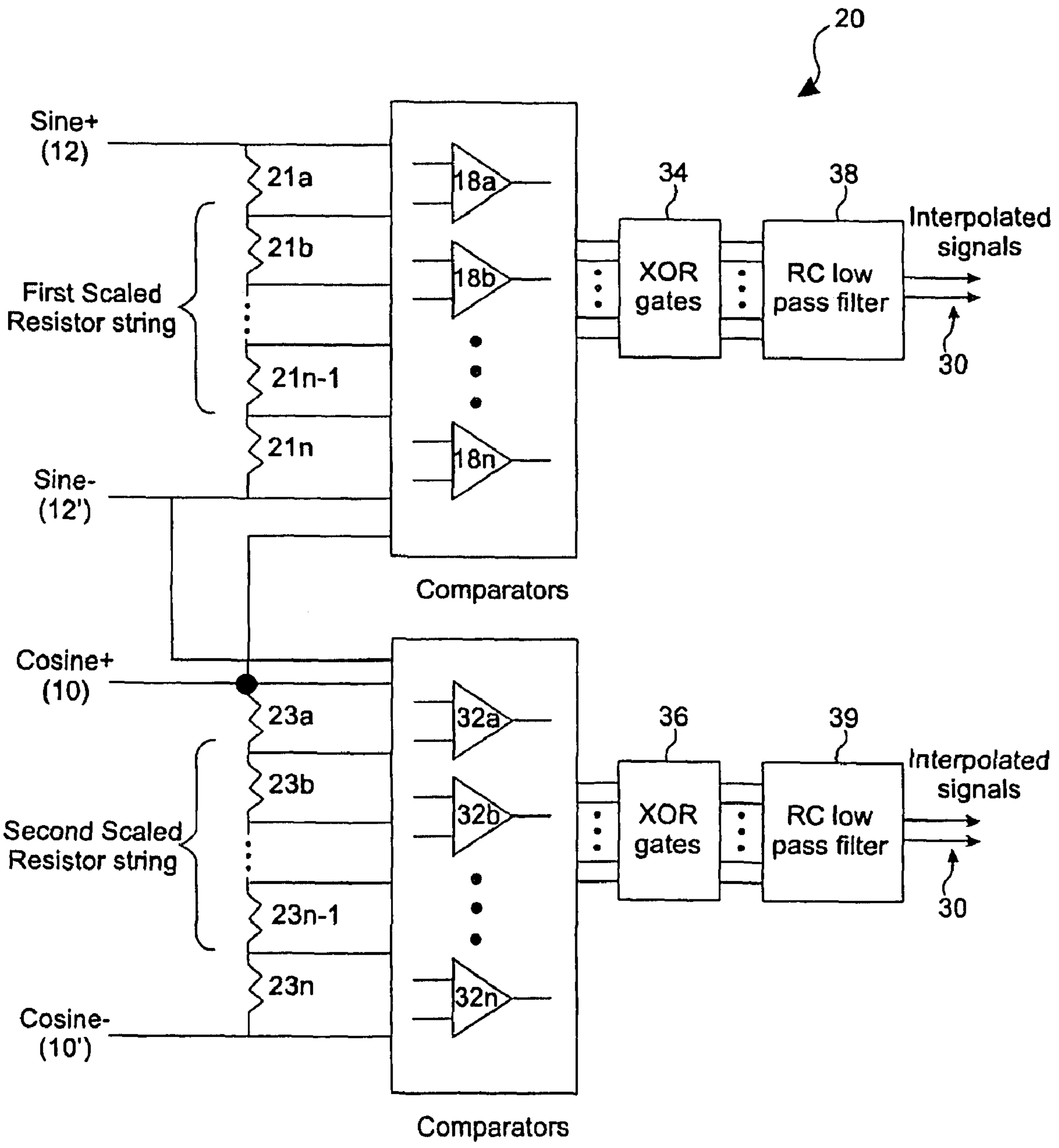
FIG. 13 shows one embodiment of interpolation circuitry comprising resistor strings, comparators, XOR gates and RC low-pass filters.

FIG. 13 shows one embodiment of interpolation circuit 20 comprising first and second scaled resistor strings 21*a* through 21*n* and 23*a* through 23*n*, respectively, first and second sets of comparators 18*a* through 18*n* and 32*a* through 32*n* having 20 mV of hysteresis each, respectively, XOR gates 34 and 36, respectively, and RC low-pass filter circuits 38 and 39. As shown in FIG. 13, input analog signals sine+, sine− (the complement of sine+), cosine+ and cosine− (the complement of cosine+) are provided to first and second scaled resistor strings 21*a* through 21*n* and 23*a* through 23*n*, where their respective amplitudes are scaled to appropriate predetermined values using appropriate pre-selected values for resistors 21*a* through 21*n* and 23*a* through 23*n*. Each resistor corresponds to a predetermined positional angle. The cross points of the scaled sine+, sine−, cosine+ and cosine− signals are compared against full-amplitude signals to generate rising or falling edges, as the case may be, at the output of comparators 18*a* through 32*n*. These edges are then fed into XOR gates 34 and 36, which generate interpolated signals, which signals are then filtered by circuits 38 and 39 to remove undesired noise spikes and yield the final interpolated output signal. According to one embodiment, the interpolated output signal can have a frequency up to about 20 times that of the input analog signals' frequency.

Figure 14:
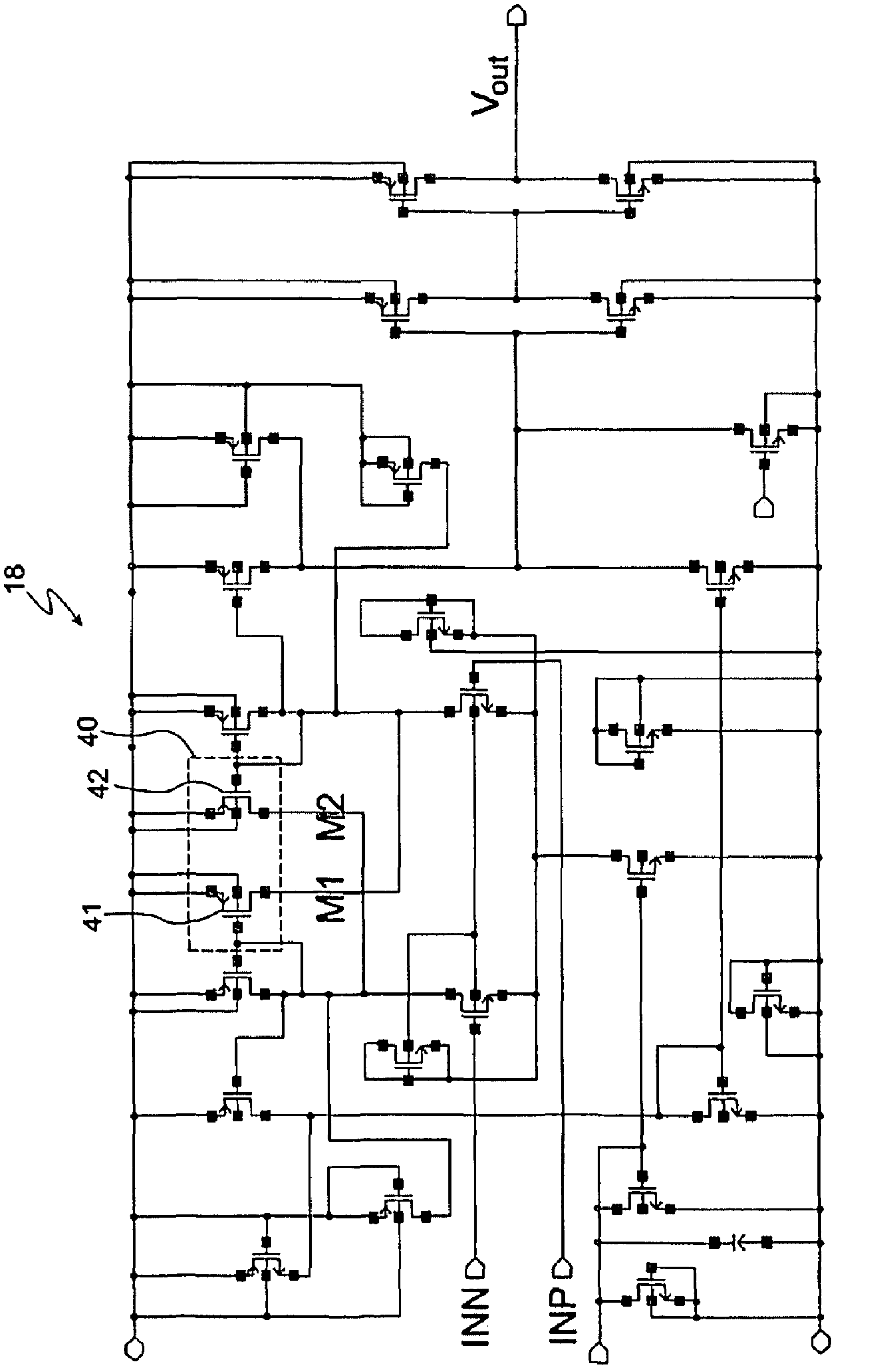
FIG. 14 shows one embodiment of a portion of interpolation circuitry.

FIG. 14 shows one embodiment of a comparator 18 that may be employed in interpolation circuit 20. Comparator 18 in FIG. 14 receives and compares two input voltage signals (INN and INP) and determines which of the two is greater. When INN is greater than INP, $V_{out}$=0. Otherwise, $V_{out}$=VDD. Some comparator circuits employ positive feedback circuit topologies to ensure nothing intermediate between the two desired predetermined output states (i.e., high and low states) may be utilized. As shown in FIG. 14, however, the hysteresis of comparator 18 may can be adjusted by sizing the dimensions (i.e., the width and length) of transistors 41 and 42 included in box 40. The dimensions of transistors 41 and 42 may be changed to tweak or adjust the resulting hysteresis of comparator 18 to a desired level.

Some of the various embodiments presented herein have certain advantages and features, including the ability to be implemented using standard CMOS processes, the ability to be implemented with relative ease and design simplicity, the ability to be implemented in both incremental and absolute motion encoders, and the ability to provide high interpolation factors without sacrificing timing accuracy.

Included within the scope of the present invention are methods of making and having made the various components, devices and systems described herein.

Various embodiments of the invention are contemplated in addition to those disclosed hereinabove. The above-described embodiments should be considered as examples of the present invention, rather than as limiting the scope of the invention. In addition to the foregoing embodiments of the invention, review of the detailed description and accompanying drawings will show that there are other embodiments of the invention. Accordingly, many combinations, permutations, variations and modifications of the foregoing embodiments of the invention not set forth explicitly herein will nevertheless fall within the scope of the invention.

We claim:

1. A method of interpolating sine and cosine analog signals generated by a motion encoder, the first and second analog signals each having a first frequency, comprising:

providing the sine and cosine signals as inputs to an interpolation processing circuit comprising first and second resistor strings configured to scale, respectively, the first and second analog signals before further processing by a plurality of comparators, each comparator being configured to generate a corresponding output pulse having a rising or falling edge timed to correspond to a predetermined one of a plurality of cross points of the scaled sine and cosine signals;

processing the sine and cosine signals in output circuitry of the interpolation processing circuit to yield a plurality of combined interpolated output signals which have a second frequency that is an integer multiple of the first frequency.

2. The method of claim 1, wherein the sine signals comprise sine+ and sine− signals.

3. The method of claim 1, wherein the cosine signals comprise cosine+ and cosine− signals.

4. The method of claim 1, wherein the plurality of interpolated output signals comprises digital pulses having logic high levels separated by logic low levels.

5. The method of claim 1, wherein the output circuitry further comprises a plurality of XOR gates located at outputs thereof, each XOR gate being configured to generate a corresponding interpolated output signal.

6. The method of claim 5, wherein the output of each XOR gate is routed to through low-pass filter.

7. The method of claim 6, wherein each low-pass filter is configured to filter out undesired noise spikes in its corresponding interpolated output signal.

8. The method of claim 7, wherein the comparators of the interpolation processing circuit are zero hysteresis comparators.

9. The method of claim 1, wherein each of the comparators has a predetermined custom hysteresis value associated therewith such that the delays caused by the comparators are substantially the same.

10. The method of claim 1, wherein the second frequency ranges between two and twenty times the first frequency.

11. The method of claim 1, wherein the interpolation processing circuit is fabricated using a CMOS process.

12. An interpolation processing circuit configured to receive sine and cosine analog signals generated by a motion encoder, the first and second analog signals each having a first frequency, comprising:

first and second resistor strings configured to scale, respectively, the first and second analog signals, and to provide scaled analog output signals therefrom;

a plurality of comparators configured to receive the scaled analog output signals, each comparator being configured to generate a corresponding output pulse having a rising or falling edge timed to correspond to a predetermined one of a plurality of cross points of the scaled sine and cosine signals; and output circuitry disposed in the interpolation processing circuit and configured to receive the outputs provided by the plurality of comparators and process same to yield a plurality of combined interpolated output signals which have a second frequency that is an integer multiple of the first frequency.

13. The circuit of claim 12, wherein the sine signals comprise sine+ and sine− signals.

14. The circuit of claim 12, wherein the cosine signals comprise cosine+ and cosine− signals.

15. The circuit of claim 12, wherein the plurality of interpolated output signals comprises digital pulses having logic high levels separated by logic low levels.

16. The circuit of claim 12, wherein the output circuitry further comprises a plurality of XOR gates located at outputs thereof, each XOR gate being configured to generate a corresponding interpolated output signal.

17. The circuit of claim 16, wherein the output of each XOR gate is routed to through low-pass filter.

18. The circuit of claim 17, wherein each low-pass filter is configured to filter out undesired noise spikes in its corresponding interpolated output signal.

19. The circuit of claim 18, wherein the comparators of the interpolation processing circuit are zero hysteresis comparators.

20. The circuit of claim 12, wherein each of the comparators has a predetermined custom hysteresis value associated therewith such that the delays caused by the comparators are substantially the same.

21. The circuit of claim 12, wherein the second frequency ranges between two and twenty times the first frequency.

22. The circuit of claim 12, wherein the interpolation processing circuit is fabricated using a CMOS process.

* * * * *